United States Patent [19]

Chen et al.

[11] Patent Number: 5,702,654
[45] Date of Patent: Dec. 30, 1997

[54] METHOD OF MAKING THERMAL SHOCK RESISTANT SAPPHIRE FOR IR WINDOWS AND DOMES

[75] Inventors: William W. Chen, Westchester; Norman H. Harris, Newhall, both of Calif.

[73] Assignee: Hughes Electronics

[21] Appl. No.: 706,090

[22] Filed: Aug. 30, 1996

[51] Int. Cl.[6] ................................................. C04B 40/00
[52] U.S. Cl. ........................ 264/82; 264/1.21; 264/235; 264/346
[58] Field of Search ................... 264/1.21, 82, 235, 264/346; 63/32

[56] References Cited

U.S. PATENT DOCUMENTS

| 2,488,507 | 11/1949 | Burdick et al. | 63/32 |
| 4,039,726 | 8/1977 | Carr | 264/82 |

OTHER PUBLICATIONS

R.L. Gentilman et al, "Strength and Transmittance of Sapphire and Strengthened Sapphire", Communications of the American Ceramic Society, Sep. 1981, pp. C116–C117.
G.F. Hurley et al, "Elevated Temperature Strengthening of Melt-Grown Sapphire by Alloying", Applied Polymer Symposium No. 29, 1976, pp. 131–149.
E.W. Kruse III et al, "Precipitation Strengthening of MgO by $MgFe_2O_4$", Journal of the American Ceramic society, vol. 55, No. 1, Jan. 1972, pp. 32–37.
D.S. Phillips et al, "Precipitation in Star Sapphire I Identification of the Precipitate", Philosophical Magazine A, vol. 41, No. 3, 1980, pp. 385–404.
S.E. Hsu et al, "Strengthening of Sapphire by Precipitates Containing Titanium", Journal of the American Ceramic Society, vol. 50, No. 3, Mar. 1967, pp. 149–151.
S.K. Roy et al, "Solubilities of Magnesia, Titani, and Magnesium Titanate in Aluminum Oxide", Journal of the American Ceramic society, vol. 51, No. 1, Jan. 21, 1968, pp. 1–6.
L. Navias, "Preparation and Properties of Spinel Made by Vapor Transport and Diffusion in the system $MgO-Al_2O_3$", Journal of the American Ceramic society, vol. 44, No. 9, Sep., 1961, pp. 434–446.
D.C. Harris et al, "Mechanism of Mechanical Failure at High Temperature", SPIE Proceedings, vol. 2286, 1994, pp. 16–25.

(List continued on next page.)

*Primary Examiner*—James Derrington
*Attorney, Agent, or Firm*—M. E. Lachman; M. W. Sales; W. K. Denson-Low

[57] ABSTRACT

Single crystal sapphire is conventionally employed for midwave IR windows and domes exposed to high aerodynamic heating environments. Single crystal sapphire, however, suffers a loss of compressive strength in the c-axis of 95% on heating from ambient to 800° C. This loss of compressive strength on heating results in poor thermal shock resistance. Poor thermal shock resistance jeopardizes the reliability of the windows and domes. The process of the present invention strengthens sapphire and improves its resistance to thermal shock by introducing magnesium (Mg) ions into the crystal lattice of sapphire to form a solid solution. The solid solution increases the strength of the sapphire. Additionally, a larger increase in strength results from converting the Mg into second phase precipitates comprising magnesium aluminate spinel. The formation of the second phase particulates results in precipitation-hardening or precipitation-strengthening due to the volume change on forming the magnesium aluminate spinel. The second phase particulates comprising magnesium aluminate spinel are held to such a small size that the second phase particulates impart increased fracture strength while not significantly degrading the IR transmission when compared with untreated sapphire. Consequently, precipitation-hardening with magnesium aluminate spinel improves the compressive strength of sapphire while retaining high thermal conductivity and IR transmission.

12 Claims, 4 Drawing Sheets

OTHER PUBLICATIONS

E.N. Bunting, National Bureau of Standards Journal of Research, vol. 6, No. 6, 1931, p. 9, cited in Phase Diagrams for Ceramists, compiled by E.M. Levin et al, Fig. 309, The American Ceramic Society, 1964.

E.F. Osborn, "Subsolidus Reactions in Oxide Systems in the Presence of Water at High Pressures", Journal of the American Ceramic Society, vol. 36, No. 5, May 1, 1993, pp. 147–151.

METHOD OF MAKING THERMAL SHOCK RESISTANT SAPPHIRE FOR IR WINDOWS AND DOMES

BACKGROUND OF THE INVENTION

1. Field of the Invention

The present invention relates generally to durable infrared (IR) windows and domes and, more particularly, to improving the compressive strength and thermal shock resistance of shaped windows and domes comprising sapphire.

2. Description of Related Art

Integration of infrared imaging systems in missiles requires highly durable infrared windows and/or domes. To fabricate windows and domes for such applications, materials that possess excellent thermal, mechanical, and optical properties are required. Although few materials possess this rare combination of characteristics, many oxide materials exist that are both highly durable and transparent to midwave IR wavelengths (i.e., wavelengths ranging from 3 to 5 micrometers).

Polycrystalline aluminum oxide is a widely used strong, lightweight ceramic material. The single crystal version of aluminum oxide ($Al_2O_3$), i.e., sapphire, is one of the hardest and most durable ceramic materials. The excellent optical properties of sapphire are reflected in the beauty of the naturally occurring sapphire and ruby gemstones. Sapphire transmits well in the infrared radiation region up to 6 μm. Sapphire is a well-characterized material for which there is a large database of physical properties. The fabrication of sapphire is also practical. Large boules (4 inches or greater in diameter by 18 inches long) can be grown in various orientations which provide high transmission and low scatter of light. The advancement in the technology of sapphire growth and synthesis is also reflected in the crystal perfection of large monolithic parts such as shaped windows and domes. Consequently, sapphire is a favorable material for domes on missiles as well as for windows on submarine masts.

Sapphire possesses a crystal structure corresponding to the corundum structure. In particular, sapphire, consists of close-packed sheets of oxygen ions ($O^{2-}$) in an essentially hexagonal close-packed arrangement. Aluminum cations ($Al^{3+}$) occupy two-thirds of the available octahedral interstices which reside between the oxygen ions.

Despite sapphire's many excellent physical properties, sapphire is not without limitations. In particular, high temperature testing has shown a degradation in the mechanical properties of sapphire. Specifically, results of the compression testing of cylindrical specimens have shown a 95 percent drop in the compressive strength along the direction of the c-axis of the crystal structure from 20° to 800° C. See, e.g., D.C. Harris et at, "Mechanism of Mechanical Failure At High Temperature", SPIE Proceedings, Vol. 2286, 1994, pp. 16–25. (The "c-axis", as used herein in its accepted meaning, corresponds to the direction perpendicular to the well-known basal planes of the hexagonal close-packed arrangement of oxygen ions in the corundum structure.) Reduction in the compression strength causes a concomitant decrease in thermal shock resistance, thus affecting the reliability.

Degradation of mechanical properties at high temperature is a significant concern for supersonic applications where windows and/or domes are exposed to severe aerodynamic heating. The thermal stresses on the windows and domes in some of these applications fall well within the regime of vulnerability to the low thermal shock resistance of sapphire, thereby rendering conventional sapphire window and dome designs structurally marginal.

Several approaches have been developed to improve the mechanical properties of sapphire. The methods that are conventionally used to improve the compressive strength of sapphire include: (1) surface polishing to remove surface cracks or flaws, (2) formation of structural coatings on the surface of the sapphire, and (3) doping in the melt stage to form a solid solution as the single crystal sapphire is grown. These methods for improving the strength of sapphire are categorized into two main areas: (1) coatings or surface treatment and (2) bulk property modification. A comparison of these above-listed methods for improving thermal shock resistance of sapphire is given in Table 1. In Table 1, maximal IR transmission, minimal IR scattering, and minimal IR emittance are characterized as favorable.

TABLE 1

COMPARISON OF PRIOR ART APPROACHES TO IMPROVING THERMAL SHOCK RESISTANCE OF SAPPHIRE

| Property | Polishing | Structural Coating | Solid Solution Doping |
|---|---|---|---|
| Ease of fabrication | Yes | Yes | Yes in low concentration; difficult to fabricate in higher concentration |
| Potential increase in compressive strength | Moderate | Moderate | Moderate |
| IR transmission | Good | Composition dependent | Good |
| IR scattering | Good | Composition dependent | Good |
| IR emmittance | Good | Composition dependent | Unknown |
| Problems | Only modest improvement in strength | Disrupts IR transmission | Decreases thermal conductivity |

Typically, the actual fracture strength of brittle materials is much lower than their intrinsic strength. Fracture usually originates at structural defects on the surface of materials. Such structural defects are either inherent in the material or introduced to the surface as the result of mechanical handling or polishing. Techniques which rely on surface modification are employed to minimize the effect of such structural defects on the surfaces of materials. Conventional approaches which employ surface modification for strengthening structural ceramics include (1) carefully controlling or improving the polishing process or (2) introducing a compressive surface layer to reduce or close a processing flaw.

Careful polishing can be employed to improve the mechanical properties of sapphire. For example, polishing processes can provide biaxial flexure strengths of 120,000 to 130,000 pounds per square inch (psi) (8,437 to 9,140 Kg/$cm^2$) for 1.5 inch diameter (3.81 cm)×0.08 inch (0.2 cm) thick discs of c-axis oriented sapphire at ambient temperature. By c-axis oriented sapphire is meant single crystal sapphire having a surface that is normal to the c-axis of the corundum structure.

Surface polishing improves resistance to fracture largely through the elimination of defects, e.g., surface cracks or flaws. However, only a moderate improvement in strength can be obtained by surface polishing. Surface polishing does not result in an order of magnitude improvement in strength which is needed to substantially increase the thermal shock resistance of sapphire.

An alternative approach conventionally employed to strengthen ceramics such as sapphire is to form a compressive surface layer on the surface of the ceramic to reduce or close a processing flaw. This approach is also based on the concept that fractures originate at flaws on the surface of the ceramic. Surface coatings are applied on the surface of the ceramic, e.g., a window comprising sapphire. The surface coating should have a lower thermal expansion coefficient than that of the window. The surface coating is formed on the window at high temperature and upon cooling the window contracts more than the surface coating. Accordingly, the surface of the window is in a state of compression. Compressive surface stresses decrease the flaw size and increase the tensile stress necessary to propagate cracks. The surface coating must be applied thick enough on the surface of the window to improve the compressive strength.

The use of glazes as a surface coating which can impart strength to ceramics is well-known. For example, an aluminosilicate ceramic can be strengthened with a coating of a compressive layer of glaze. The use of such a compressive layer is both simple and effective. The effect of compressive surface coatings on sapphire have been investigated by R. L. Gentilman et at, "Strength and Transmittance of Sapphire and Strengthened Sapphire", Communications of the American Ceramic Society, September 1991, pp. C116–C117. Gentilman et al tested a surface coating comprising a glaze as well as a surface coating comprising mullite ($3Al_2O_3 \bullet 2SiO_2$).

Employing compressive surface layers to strengthen sapphire domes or windows, however, is more complex and difficult due to the constraints of optical requirements. Optical coatings are generally incompatible with the compressive surface layers which are employed for structural purposes. Coating thicknesses for optical coatings are on the order of $\lambda/2$ thick, while the thickness of the compressive surface layers are an order of magnitude thicker than $\lambda/2$. Additionally, the molecular constituents of the compressive surface layer must be non-absorbing in the infrared. For instance, silicate-based glazes have Si-O bonds which absorb light having a wavelength of about 2.5 µm. As a result, IR transmission may be sacrificed with the application of the compressive surface layer.

For high load-bearing ability, good interfacial bonding between the compressive surface layer and the sapphire window is generally considered to be essential. Accordingly, lattice matching of the sapphire and the compressive surface layer is critical.

Surface treatment is moderately successful only when the mechanism of the compressive strength degradation is due to surface flaws. Since the 95% compressive strength degradation is due to a different mechanism, described below, the use of surface treatment will not be particularly effective.

In the alternative, the compressive strength of sapphire can be improved by modifying the bulk properties of the sapphire. There are two common methods used to strengthen the bulk properties of ceramics: solid-solution (SS) strengthening and precipitation-hardening.

Solid-solution strengthening involves the introduction of solute atoms into a lattice consisting of solvent atoms. A solid solution which is a single-phase structure is thereby formed. If the solute atoms and the solvent atoms are roughly similar in size, the solute atoms will occupy lattice points in the lattice of the solvent atoms. Such a solid solution is called a substitutional solid solution.

The amount of published work on the effects of additions of impurities on the mechanical properties of ceramics is meager compared to that for metals. For ceramics, additions of different-sized ions or impurities having different valency can cause solid-solution strengthening. Invariably, solid-solution strengthening of a pure material produces an alloy which is stronger than the pure material.

With sapphire, only a relatively small number of alloy systems permit extensive solid solubility between two or more elements. Due to the limited solubility of the solid-solution additions, i.e., the solute atoms, only a relatively small hardening effect can be produced in most alloy systems involving sapphire.

Chromium (Cr) is a cation that is completely soluble in $Al_2O_3$, according to the phase diagram for the $Al_2O_3$-$Cr_2O_3$ system; see, e.g., E. N. Bunting, National Bureau of Standards Journal of Research, Vol. 6, No. 6, 1931, pg. 9. Accordingly, Cr is used as a dopant which is introduced during the growth of single crystal sapphire. The Cr dopants are introduced in the melt stage as the single crystal sapphire is grown. Chromium doping results in solid solution doping within the crystal lattice of sapphire.

Chromium doping yields the characteristic red color that is well-known in ruby sapphire gemstones. Additionally, chromium doping of sapphire to form a solid solution improves the strength of sapphire. Specifically, G. F. Hurley et al, "Elevated Temperature Strengthening of Melt-Grown Sapphire by Alloying", Applied Polymer Symposium, No. 29, 1976, pp. 131–149 report that melt-grown sapphire fiber doped with 0.5 percent chromia ($Cr_2O_3$) has 25 percent higher strength over that of pure sapphire tested at 1310° C.

The difficulty with Cr doping to form a solid solution is that the strength and thermal shock improvements are small. Although the phase diagram for the $Al_2O_3$/$Cr_2O_3$ system indicates that Cr is completely soluble in sapphire, higher doping of sapphire with chromia to produce more durable windows and domes is limited due to practical issues. For instance, increasing doping levels threefold to 1.5 weight % $Cr_2O_3$ produces sapphire fibers containing substantial amounts of microvoids, precipitates, and a more inhomogeneous impurity content throughout the fibers. Realistic strengthening of sapphire fiber by adding 1.5 weight % $Cr_2O_3$ is achievable, and possibly substantial, provided that such doping can be produced without the simultaneous formation of voids.

Additionally, melting is necessary for introducing significant amounts of Cr dopant into sapphire. The universal difficulty with melt solidification fabrication or melt processing of ceramics (i.e., melting, doping, and solidifying to form a solid solution) is that cooling rates must be restricted. These cooling rates are limited in order to prevent fracture due to thermal shock or to prevent high built-in internal stresses. However, slow or equilibrium cooling exacerbates control of uniform cation distribution such as for Cr. Consequently, achieving good control of mechanical properties by higher doping levels using sapphire grown via melt processing is often impossible. This limitation of equilibrium cooling will be discussed more fully below.

Doping with Ti also results in very limited solid solution within the crystal lattice of sapphire. Improving the strength of sapphire by doping with larger concentrations of Ti in solid solution is limited due to the low solubility of Ti ions in the sapphire lattice. Accordingly, titanium doping provides small improvements in the strength of sapphire.

Thus, doping sapphire with Cr and Ti to form a solid solution results in sapphire only marginally strong in comparison to requirements for missile dome applications.

A review of the prior art literature, however, shows that precipitation strengthening or precipitation-hardening is effective in strengthening aluminum oxide. By precipitation-hardening is meant the controlled precipitation of particulates in a material, thereby increasing the strength thereof. For example, precipitate-hardened aluminum oxide is achieved when sapphire is alloyed with Ti and aged to induce the precipitation of rutile crystals. These rutile crystals impart the characteristic of asterism which is observed in the famed "star sapphire" gemstones. Asterism in star sapphires is caused by the scatter of light from the rutile crystals. The optical scattering caused by micrometer size precipitates of rutile is reported by D. S. Phillips et al, "Precipitation in Star Sapphire I. Identification of the Precipitate", Philosophical Magazine A, Vol. 42, No. 3, 1980, pp. 385–404.

A star sapphire was first prepared synthetically in the form of Verneuil-grown boules of sapphire crystal doped with 0.1 to 0.3 weight % $TiO_2$ by aging at temperatures between 1100° and 1500° C.; see, e.g., J. N. Burbick et al, "Synthetic Star Rubies and Star Sapphires and Process for Producing Same", U.S. Pat. No. 2,488,507, issued Nov. 15, 1949. This process of aging resulted in precipitation of needle-shaped precipitates of $TiO_2$. These precipitates of $TiO_2$ increase the strength of the sapphire; see, e.g., S. E. Hsu et al, "Strengthening of Sapphire by Precipitates Containing Titanium", Journal of the American Ceramic Society, Vol. 50, No. 3, March 1967, pp. 149–151. Hsu et al grew Ti-doped $Al_2O_3$ crystals and found a significant improvement in the mechanical properties over unalloyed sapphire for Ti-doped $Al_2O_3$ crystals having a concentration of 0.5% Ti and aged at 1500° C. Difficulty was experienced in growing homogeneous crystals with a high volume fraction of precipitate. However, in comparison to undoped sapphire, a twofold improvement in the fracture load was observed for the sapphire crystals having Ti precipitates formed therein.

Disadvantageously, processing difficulties are associated with precipitation-hardening of sapphire using Ti. Titanium dissolves in sapphire only in the liquid phase, thus requiring melt processing and equilibrium cooling. Additionally, only small concentrations of titanium are soluble in sapphire to form a solid solution. Excess titanium contained in the sapphire melt is uncontrollably precipitated as rutile upon solidification. Uncontrolled precipitation results in a non-uniform size distribution and volume fraction of the $TiO_2$ precipitates. Mechanical properties, although improved, are non-uniform. Large precipitate size and non-uniformity of the precipitate size distribution, as well as non-uniformity of the volume fraction distribution of the $TiO_2$ precipitate, cause optical scattering (i.e., asterism), low transmission, and non-uniformity of the optical and mechanical properties.

Since conventional approaches are incapable of producing thermal shock resistant sapphire, a novel approach is necessary. Thus, there remains a need for a method that significantly improves the thermal shock resistance of sapphire by increasing the c-axis compressive strength without degrading the IR transmission, optical scattering, and emittance properties of the sapphire.

SUMMARY OF THE INVENTION

In accordance with the present invention, a process is provided for strengthening a sapphire article having a volume comprising sapphire and having an outer surface. The process comprises the steps of:

(a) diffusing magnesium into at least a portion of the sapphire by exposing the sapphire article to magnesium vapor at a first temperature for a first time period;

(b) heating the sapphire article to a second temperature, higher than the first temperature, in the absence of magnesium vapor, for a second time period, thereby causing the magnesium to be distributed throughout the volume of the sapphire article;

(c) quenching the sapphire article to thereby cool the sapphire article to a third temperature, lower than the first temperature, over a third time period; and (d) annealing the sapphire article at the third temperature for a fourth time period, thereby causing precipitation of magnesium aluminate spinel particulates comprising magnesium aluminate spinel having the spinel crystal structure, the magnesium aluminate spinel particulates serving to precipitation-harden the sapphire article.

Additionally a sapphire article is provided comprising:

(a) sapphire comprising a continuous matrix of $Al_2O_3$ having a crystal structure corresponding to a corundum structure; and (b) magnesium aluminate spinel particulates comprising magnesium aluminate spinel having a spinel crystal structure, the magnesium aluminate spinel particulates distributed throughout the continuous matrix of $Al_2O_3$ and serving to precipitation-harden the sapphire article.

The process of the present invention provides a method for improving the compressive strength of sapphire articles while retaining its high thermal conductivity and IR transmission. Increasing the compressive strength of sapphire solves the problem of poor thermal shock resistance. Accordingly, the process of the present invention significantly improves the thermal shock resistance of sapphire without degrading the IR transmission, scattering, and emittance properties.

Increased thermal shock resistance means that the missile domes and windows formed from sapphire are less likely to fail. Additionally, employing windows and domes which are precipitation strengthened with the process of the present invention permits thinner windows to be employed thereby providing increased IR transmission.

DESCRIPTION OF THE PREFERRED EMBODIMENTS

Figure 1:
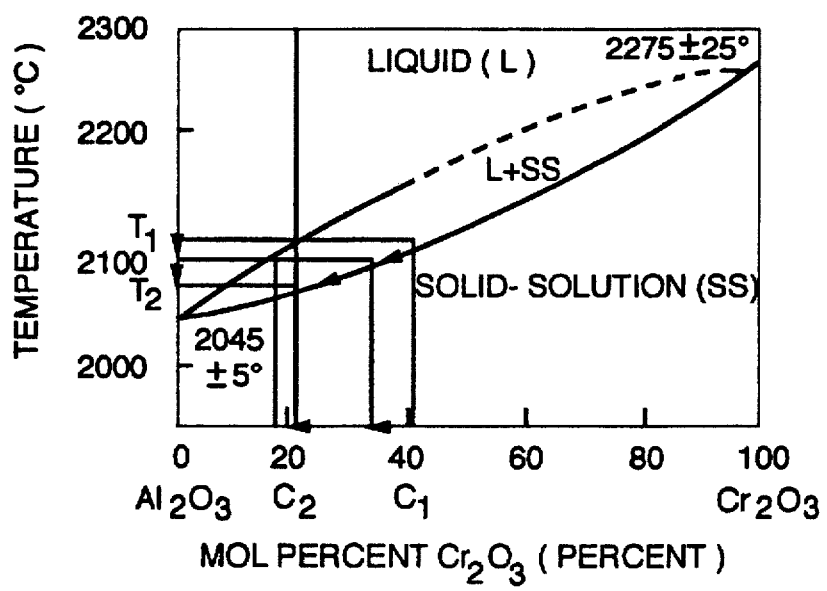
FIG. 1 on coordinates of temperature (in Celsius) and mol percent $Cr_2O_3$ (in percent), is a phase equilibrium diagram for the $Al_2O_3$-$Cr_2O_3$ system.

Reference is now made in detail to a specific embodiment of the present invention, which illustrates the best mode presently contemplated by the inventors for practicing the invention. Alternative embodiments are also briefly described as applicable.

The present invention is directed to precipitation-hardening to improve the compressive strength of sapphire while retaining its high IR transmission.

The origin of the inadequate supersonic thermal shock resistance of sapphire is not expected to be an extrinsic property and/or a result of surface factors such as fractures formed on the surface by processing. Rather, the inadequate supersonic thermal shock resistance of sapphire is expected to result from an intrinsic property of bulk sapphire. Accordingly, strengthening approaches that modify the inherent bulk properties of sapphire should be effective.

As described above, high temperature failure in sapphire crystal occurs most easily when the sapphire crystal experiences compressive forces along the c-axis. Compressive strengths along the c-axis decrease from approximately 2,000 MPa at room temperature to less than 100 MPa at 800° C. This reduction in compressive strength is large in contrast to reductions from about 2,000 MPa to 1,580 MPa along other directions in the sapphire crystal such as along one of the a-axes. The term "c-axis", as used herein in its accepted meaning, corresponds to the direction perpendicular to the well-known basal planes of the hexagonal close-packed arrangement of oxygen ions in the corundum structure. The term "a-axes" is also used herein in its accepted meaning with respect to the corundum structure. As is well-known, the a-axes are perpendicular to the c-axis.

The degradation in compressive strength along the c-axis results from twinning along the ($1\bar{1}02$) plane at high temperature. As is well-known, twinning involves a shifting of atoms or ions on one side of a twin boundary or twinning plane. The amount of shifting of the atoms or ions is proportional to the distance from that twinning plane. In this case, the twinning plane is a plane having the crystallographic orientation equivalent to the ($1\bar{1}02$) plane of the corundum structure.

The twin formation is a response by the sapphire crystal to the external compressive forces along the c-axis. The twinning temporarily relieves the induced stress. Since twinning reduces stress derived from c-axis compression, twinning likely represents a thermodynamically favored configuration for sapphire at all temperatures when subjected to compressive loading along the c-axis. However, since twinning involves a rearrangement of the ions within the structure of the crystal, an activation energy barrier must be overcome for the transition into the twinning mode. This activation energy barrier is significant enough to be overcome only at higher temperature, e.g., 800° C. Accordingly, sapphire exhibits decreased strength during c-axis compression only at temperatures elevated above room temperature.

Thus, increasing the activation energy barrier offers a means for preventing the transition into the twinning mode. By providing additional barriers to the movement of ions at the higher temperatures, the activation energy barrier may be increased. Accordingly, twinning is prevented and the crystal strength is maintained even at the higher temperatures.

Solid-solution strengthening, as described above, is a well-known prior art technique for increasing the strength of materials by doping. In particular, doping the sapphire crystal improves the compressive strength by providing barriers to the movement of ions. Doping produces small amounts of strain in the lattice structure. The strain in the lattice structure may be created by dopants introduced into the lattice via interstitial stuffing. Alternatively, strain in the lattice structure may be produced by doping if the dopant ions and the ions comprising the crystal are dissimilar in size, yet the dopant atoms occupy lattice points in the lattice of the crystal. In such a substitutional solid solution, the mismatch in ion size induces the strain. In either case, the resulting strain represents additional forces that must be overcome for ion migration and twin formation.

Solid-solution strengthening is conventionally employed in numerous alloys to prevent slip, i.e., a shear-like movement in a crystal structure. Solid-solution strengthening is also a conventional method for preventing the movement of dislocations, i.e., lines of missing atoms or ions.

As described above, solid-solution strengthening of sapphire can be achieved by chromium doping. To form a solid solution, the Cr dopants are introduced in the melt stage as the single crystal sapphire is grown. Typically chromia, $Cr_2O_3$, is dissolved in $Al_2O_3$, i.e., sapphire. Disadvantageously, the strength and thermal shock improvements achieved by doping sapphire with Cr are small.

Conventional solid-solution hardening of sapphire is difficult because equilibrium cooling or equilibrium solidification processing is typically employed. As described above, the universal difficulty in the melt solidification fabrication of ceramics is that cooling rates must be restricted. These cooling rates are limited in order to prevent fracture due to thermal shock or to prevent high built-in internal stresses. Slow or equilibrium cooling, however, exacerbates control of uniform cation distribution such as for Cr ions.

Referring now to FIG. 1, which depicts the phase equilibrium diagram for the $Al_2O_3$-$Cr_2O_3$ system, it is seen that this phase equilibrium diagram includes regions corresponding to a liquid phase field (L), a solid-solution phase field (SS), and a two-phase field wherein both a liquid phase and a solid-solution phase are present (L+SS); see, e.g., E. N. Bunting, National Bureau of Standards Journal of Research, Vol. 6, No. 6, 1931, pg. 9. The phase equilibrium diagram illustrated in FIG. 1 shows that the solubility boundary, i.e., the boundary between the liquid phase and the solid-solution phase, shifts with temperature through the two-phase field comprising both a liquid phase and solid-solution phase. Equilibrium cooling through this two-phase field will result in fractions of $Al_2O_3$-$Cr_2O_3$ composition having various concentrations of the constituent parts: $Al_2O_3$ and $Cr_2O_3$. For example, cooling an 80% $Al_2O_3$-20% $Cr_2O_3$ composition from temperatures $T_1$ to $T_2$ will solidify an alumina/chromia solid solution that varies in composition from concentrations $C_1$ to $C_2$. With $Cr_2O_3$ doping, the solid solution phase formed on solidification via equilibrium cooling will have a range of compositions. Consequently, the mechanical properties are not uniform throughout the Cr doped sapphire. Thus, achieving good control of mechanical properties with higher doping levels using melt grown sapphire and equilibrium cooling is often impossible.

However, depending on the particular host crystal and dopant (i.e., solvent atoms and solute atoms, respectively) dopant concentrations can exceed the solid solubility of the host crystal. The formation of second phase particulates results from doping in excess of the solid solubility of the host crystal. The second phase particulates are referred to in association with a "second phase" since the host crystal or continuous matrix phase corresponds to the first phase. The continuous matrix phase and the second phase particulates each comprise separate phases, i.e., each possesses different compositions and/or crystal structures. The formation of the second phase particulates in the host crystal increases the strength thereof.

As described above, the process of the controlled precipitation of second phase particulates in a material to increase the strength thereof is called precipitation-strengthening or precipitation-hardening and is well-known in the art. The controlled formation of second phase particulates in a material can be accomplished by introducing dopants into the material to form a solid solution. Typically, the solid solution is formed by doping the material at an elevated temperature. At this elevated temperature, the second phase is in solid solution. The solid solution is subsequently quenched. The second phase precipitates upon quenching and aging or annealing at a lower temperature. Careful annealing of supersaturated solid solutions stimulates controlled nucleation and growth of the second phase particulates. A prerequisite for precipitation-hardening is that the second phase must be soluble at an elevated temperature but must exhibit decreasing solubility with decreasing temperature.

The presence of the second phase particulates results from supersaturation of the host crystal. Accordingly, for two-phase alloys produced by equilibrium cooling, the existence of second phase particulates ensures maximum solid-solution hardening.

The second phase particulates strengthen the material beyond the strengthening provided by solid-solution hardening. The traditional role of the second phase particulates in strengthening a material is to raise the yield stress of the material by interacting with gliding dislocations. Additionally, the presence of second-phase particulates in the host crystal or continuous matrix phase results in localized internal stresses which modify the plastic properties of the continuous matrix phase. By continuous matrix phase is meant the solid solution formed by doping the host crystal. The strengthening produced by the introduction of second-phase particulates, i.e., precipitation-hardening, is larger than the strengthening produced solely by solid-solution strengthening. The strengthening produced by precipitation-hardening comprises the sum of both the solid-solution strengthening of the matrix and the precipitate-strengthening due to the second-phase.

An example of the effects of precipitation-hardening on the mechanical properties of MgO ceramic is reported by E. W. Kruse III et at, "Precipitation Strengthening of MgO by MgFe$_2$O$_4$", Journal of the American Ceramic Society, Vol. 55, No. 1, January 1972, pp. 32–37. Kruse III et al show that the microhardness, yield stress, and fracture toughness of single MgO (magnesia) are enhanced by nucleation and growth of a spinel precipitate, i.e., a second phase particulate having the crystal structure corresponding to the well-known spinel structure. In contrast, magnesia has a crystal structure corresponding to the sodium chloride structure.

Iron is diffused into MgO by packing single crystals of MgO in a powder mixture of Fe$_2$O$_3$ and MgO and annealing for two weeks at 1400° C. Precipitation-hardening is achieved by solution treating the MgO crystal for 24 hours at 1400° C., quenching rapidly in air, and aging in air at 550° to 800° C. By solution treating is meant homogenizing the iron concentration (dopant) throughout the MgO crystal (host crystal). Consequently, any concentration gradient of the iron in the MgO crystal is leveled out.

Figure 2:
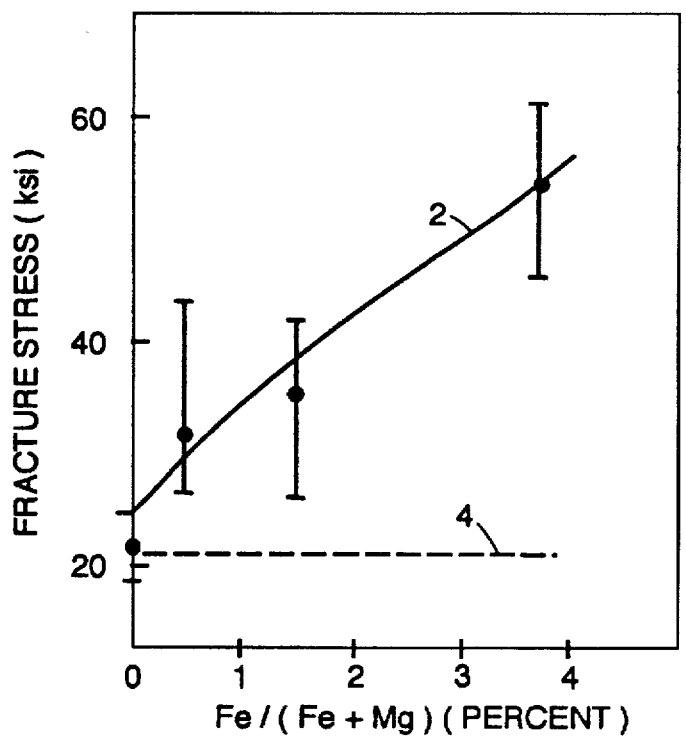
FIG. 2, on coordinates of fracture stress (in ksi, i.e., thousand pounds per square inch) and Fe/(Fe+Mg) (in percent), is a plot of the average fracture stress in compression as a function of composition for precipitation-hardened single crystal MgO.

Precipitates comprising MgFe$_2$O$_4$ (magnesioferrite) having a crystal structure corresponding to the well-known spinel structure are formed in the single crystal MgO. The MgFe$_2$O$_4$ precipitates strengthen the single crystal MgO. The composition of the precipitates, in particular, the dopant concentration defined by Fe/(Fe+Mg), influences the extent of hardening that is achieved. The effects of the dopant concentration of the MgFe$_2$O$_4$ precipitate on the strength of the precipitation-hardened magnesia crystal are shown in FIG. 2. Curve 2 plots the fracture stress in compression as a function of dopant concentration, i.e., Fe/(Fe+Mg), for the precipitation-hardened magnesia crystal. In contrast, Curve 4 plots the fracture stress of pure single crystal MgO. FIG. 2 shows that the precipitation-hardening of the magnesia crystal can yield approximately a three-fold increase in the compressive strength. For dopant levels up to 3.5 percent Fe, the average compressive fracture strength is improved to almost 60,000 psi.

Figure 3:
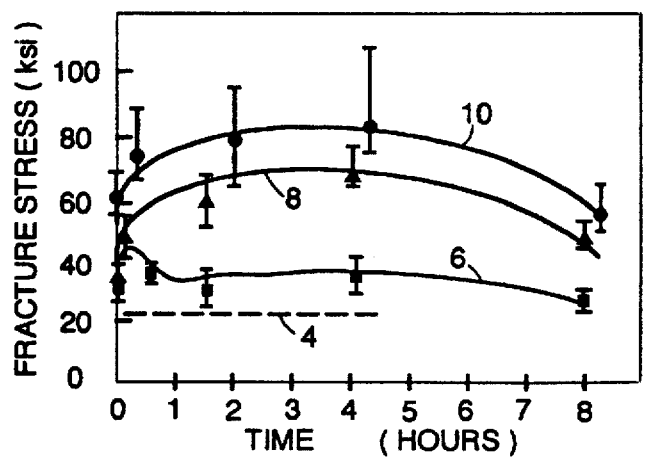
FIG. 3, on coordinates of fracture stress (in ksi) and time (in hours), is a plot of the average fracture stress in compression versus aging time at 800° C. for various compositions of precipitation-hardened single crystal MgO.

The average compressive fracture strength is dependent not only upon the concentration of the dopant but also upon the size of the MgFe$_2$O$_4$ precipitate. The effects of the size of the MgFe$_2$O$_4$ precipitate on the resultant strength are shown in FIG. 3. The MgFe$_2$O$_4$ precipitates grow with aging. Consequently, longer aging times correspond to longer growth times and thus, larger precipitate size. In FIG. 3, Curves 6, 8, and 10 plot the fracture stress in compression versus aging time at 800° C. for various Fe dopant concentrations of precipitation-hardened magnesia crystal. Specifically, Curves 6, 8, and 10 correspond to Fe dopant concentrations of 0.55%, 2.2%, and 3.65%, respectively. As described above, Curve 4 plots the fracture stress of pure single crystal MgO. The maximum strength of the precipitate-hardened magnesia crystal was achieved when the Fe dopant concentration, i.e., Fe/(Fe+Mg), was 3.65 percent and the nucleated magnesioferrite precipitate was 4 nm in size. Accordingly, fracture strength is maximized by controlling both the concentration and aging of the second phase particulates.

The example of precipitation-hardened magnesia crystal described above shows that precipitation-hardening is an effective technique which improves the mechanical properties of a material. In particular, the process of the present invention employs precipitation-hardening of sapphire to strengthen the sapphire and to reduce the vulnerability of the sapphire to compressive stress at high temperature. Sapphire, which is susceptible to twinning, as described above, is strengthened by the precipitation of second phase particulates. In this case, the sapphire host crystal corresponds to the first phase. The second phase particulates correspond to a second phase that is different from the first phase comprising the sapphire host crystal. The sapphire host crystal and the second phase particulates are each separate phases, i.e., each possesses different compositions and/or crystal structures. (The first phase may also consist essentially of a solid solution of the sapphire host crystal and dopants.)

The second phase particulates introduced by precipitation-hardening impart an increased strain to the lattice structure larger than the strain induced by solid-solution hardening. Additionally, the second phase particulates act as physical barriers to motion of atoms or ions. As a result, the second phase particulates produce a significant increase in the activation energy barrier to twinning, and also act to block the propagation of a twin once initiated.

However, as described above, a prerequisite for precipitation-hardening is that the second phase must be soluble at an elevated temperature and must exhibit decreasing solubility with decreasing temperature. Supersaturation of the host crystal is necessary for the formation of second phase particulates. The requirements for extensive supersaturation and decreasing solubility with temperature, however, limit the number of sapphire-based systems useful for precipitation-hardening. Additionally, the dopant selected to be introduced into the sapphire single crystal must not only be quite soluble in sapphire, but the second phase particulate which results from precipitation-hardening must not scatter or absorb IR radiation for wavelengths up to 6 μm. Accordingly, the design of a sapphire-based ceramic window or dome is, in practice, influenced by a compromise between mechanical and optical requirements.

In the process of the present invention, precipitation-hardening of sapphire is achieved with the precipitation of particulates comprising magnesium aluminate spinel. Magnesium aluminate spinel comprises $MgAl_2O_4$ having a crystal structure corresponding to the well-known spinel structure. Magnesium aluminate spinel is transparent to IR wavelengths. Consequently, magnesium aluminate spinel in single phase is conventionally employed in missiles as material for constructing domes to be used for mid-IR wavelengths. A large database of physical data exists for magnesium aluminate spinel in single phase.

Figure 4:
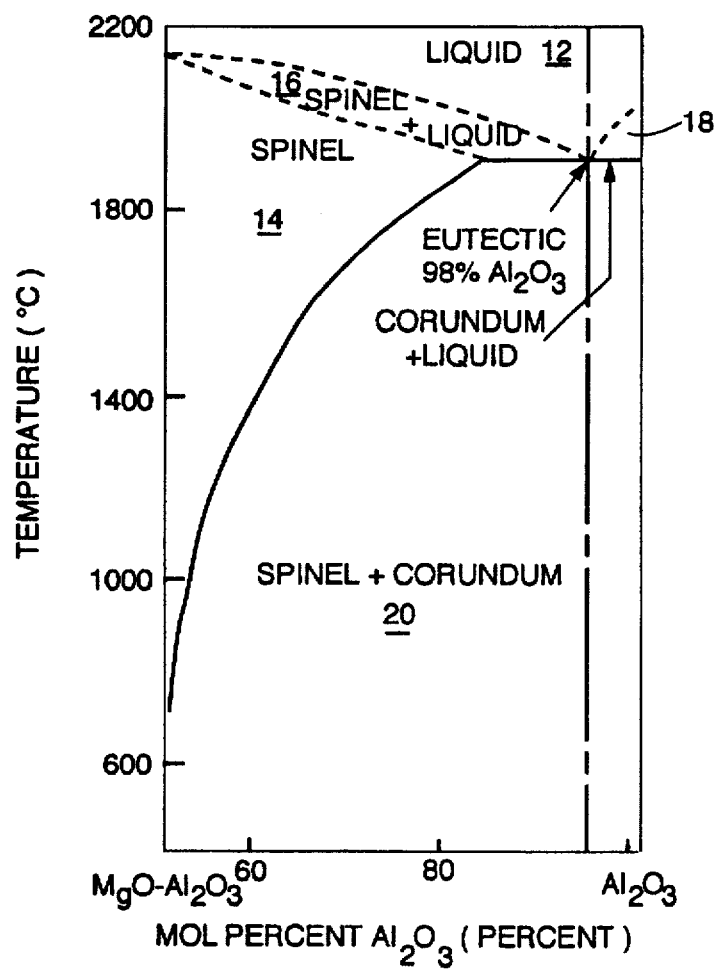
FIG. 4, on coordinates of temperature (in Celsius) and mol percent $Al_2O_3$ (in percent), depicts a portion of a pseudo-binary phase diagram for the $MgO.Al_2O_3$-$Al_2O_3$ system.

Turning now to FIG. 4, a phase diagram of the $MgO.Al_2O_3-Al_2O_3$ system is depicted. Shown in FIG. 4 are both regions in the phase diagram for the $MgO.Al_2O_3Al_2O_3$ system where a single phase is present and regions where two phases are present; see, e.g., E. F. Osborn, "Subsolidus Reactions in Oxide Systems in the Presence of Water at High Pressures", Journal of the American Ceramic Society, Vol. 36, No. 5, May 1, 1953, pp. 147–151 which provides a similar phase diagram for the $MgO.Al_2O_3-Al_2O_3$ system. Region 12 corresponds to a liquid phase field. Region 14 corresponds to a phase field wherein a single phase of spinel, i.e., magnesium aluminate spinel, is present. This single phase of magnesium aluminate spinel has a molecular composition corresponding to $1MgO:1Al_2O_3$ to $1MgO:2-3Al_2O_3$ and a crystal structure corresponding to the spinel structure. Region 16 corresponds a phase field comprising spinel ($MgAl_2O_4$) and liquid. Region 18 corresponds to a phase field comprising liquid and corundum, i.e., sapphire ($Al_2O_3$), having a crystal structure corresponding to the corundum structure. Region 20 corresponds to a phase field comprising both spinel ($MgAl_2O_4$) and corundum ($Al_2O_3$).

Melt processing can be employed to dissolve MgO in $Al_2O_3$ and thereby form $MgAl_2O_4$ having a crystal structure corresponding to the spinel structure. MgO is dissolved in $Al_2O_3$ in the liquid phase (region 12). Equilibrium cooling is performed such that the two phases, spinel ($MgAl_2O_4$) and corundum ($Al_2O_3$), form (region 20). As described above, equilibrium cooling through a two-phase field such as through region 16 comprising liquid and spinel ($MgAl_2O_4$) or through region 18 comprising corundum ($Al_2O_3$) and liquid will result in fractions of $MgO.Al_2O_3-Al_2O_3$ composition having various concentrations of the constituent parts: $MgO.Al_2O_3$ and $Al_2O_3$. FIG. 4, however, shows a eutectic at 2 wt % $MgO.Al_2O_3$. Equilibrium cooling through the eutectic avoids cooling through a two-phase field such as in region 16 or region 18. Slow solidification of an alumina-rich liquid having 2 wt % $MgO.Al_2O_3$ results in a two-phase lamellar microstructure of almost pure alumina ($Al_2O_3$) and spinel ($MgAl_2O_4$). However, cooling through the eutectic requires 2 wt % $MgO.Al_2O_3$ (i.e., 98% $Al_2O_3$ and 2% MgO) and, thus, limits the extent of doping that can be achieved. Additionally, for the purpose of precipitation-hardening, wherein $MgAl_2O_4$ particulates are formed, the size of the $MgAl_2O_4$ particulates grow with time. Longer cooling times correspond to longer growth times and thus, larger particulate sizes. As a result, restricting the size of the particulates to the nanometer range is difficult due to the extremely slow cooling rate required for melt processing and equilibrium cooling. Thus, fabricating $MgAl_2O_4$ precipitate hardened sapphire windows and domes using a melt process and equilibrium cooling is not practical or possible.

However, pure solid sapphire can be converted into magnesium aluminate spinel by the vapor phase transport of magnesia in a hydrogen atmosphere; see, e.g., L. Navias, "Preparation and Properties of Spinel Made by Vapor Transport and Diffusion in the System $MgO-Al_2O_3$", Journal of the American Ceramic Society, Vol. 44, No. 9, September, 1961, pp. 434–446, which reports the solid state diffusion of magnesium into sapphire at elevated temperature.

In a hydrogen atmosphere, MgO is vaporized by heating periclase, or solid MgO, to a temperature within the range of about 1500° to 1900° C. Vapor products from the vaporized MgO diffuse into the sapphire or $Al_2O_3$, converting the sapphire into spinel ($MgAl_2O_4$), i.e., magnesium aluminate spinel. The Mg does not diffuse into the sapphire instantaneously; rather, the Mg gradually diffuses into the sapphire, causing the sapphire to be incrementally transformed into magnesium aluminate spinel. The reaction which converts the sapphire into magnesium aluminate spinel proceeds inwardly from the outer surfaces of the sapphire.

Navias, supra, reports that the vapor phase transport of magnesia can be used to convert pure sapphire into a composite having a central region or core comprising sapphire which is surrounded by an outer layer comprising magnesium aluminate spinel. The outer layer of the magnesium aluminate spinel is formed from the outermost regions of the sapphire. However, the concentration of the Mg between the outermost regions of the sapphire which are converted to magnesium aluminate spinel and the core comprising pure sapphire is not homogeneous. Rather, the concentration of the Mg is graded from the outer layer of magnesium aluminate spinel to the core comprising pure sapphire. A continuous change in composition from $1MgO:1Al_2O_3$ to $1MgO:2-3Al_2O_3$ is present.

Navias reports that the lattice constant and refractive index varies in a fairly uniform manner from the outermost surface of the layer of magnesium aluminate spinel to the core comprising pure sapphire. For example, Navias shows that clear rods of magnesium aluminate spinel with polished ends which act as thin lenses owing to the increase in refractive index from the outer layer of magnesium aluminate spinel to the inner central region, i.e., the core comprising sapphire.

Figure 5:
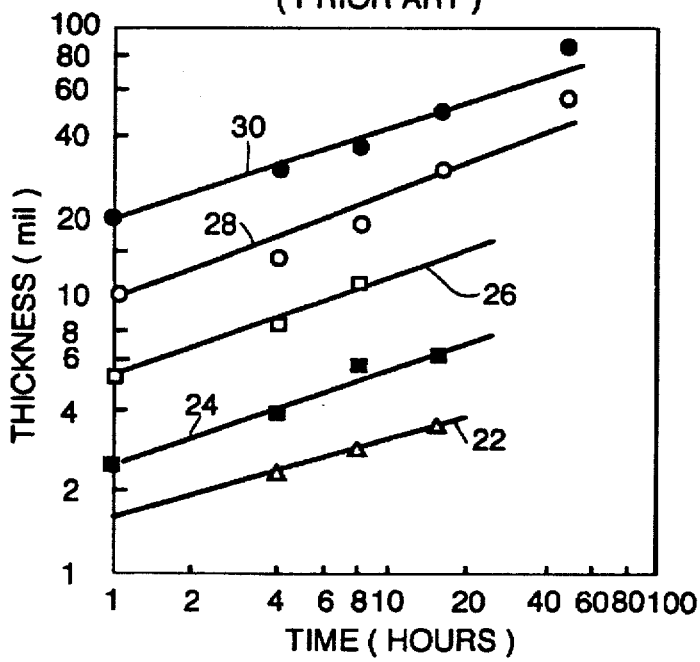
FIG. 5, on coordinates of thickness (in mil) and time (in hours), is a plot of the thickness of magnesium aluminate spinel developed on sapphire as a function of time for various temperatures.

FIG. 5 plots the thickness of the magnesium aluminate spinel developed on sapphire as a function of time for various temperatures of processing. Curves 22, 24, 26, 28, and 30 correspond to reaction temperatures of 1500°, 1600°, 1700°, 1800°, and 1900° C., respectively. FIG. 5 shows that the thickness of the layer of magnesium aluminate spinel formed on the sapphire increases with time. The dependency of thicknesses with temperature in the range between 1500° and 1900° C. indicates that the rate of conversion increases with temperature. With higher temperature, the rate of diffusion of the Mg in the sapphire increases and hence the rate of conversion of the sapphire into magnesium aluminate spinel increases. Navias also reports that if the sapphire is exposed to the vaporized MgO for a sufficiently long period of time, then the Mg can be diffused entirely throughout the sapphire. Navias shows whole sapphire samples which are completely transformed.

Based on theoretical calculations, the volume of a specimen comprising sapphire which is converted into magnesium aluminate spinel increases 55 percent due to the density difference between the sapphire (3.98 g/cc) and the magnesium aluminate spinel (3.578 g/cc for stochiometric magnesium aluminate spinel). Consequently, stress is produced from the volumetric mismatch associated with the formation of a layer of magnesium aluminate spinel on sapphire. This stress may cause cracking at the interface between the layer of magnesium aluminate spinel and the sapphire. However, the magnesium aluminate spinel layer adheres tenaciously to the sapphire; see, e.g., R. C. Rossi et al, "Epitaxial Growth of Spinel by Reaction in the Solid State", Journal of the American Ceramic Society, Vol. 46, No. 3, March, 1963, pp. 145–149.

The process of the present invention employs the vapor phase transport of magnesium described above to introduce Mg ions into the host crystal, i.e., sapphire. A magnesium-doped sapphire solid solution is thereby formed. This solid solution will increase the strength of the sapphire. However, a larger increase in strength is produced by forming second phase particulates comprising magnesium aluminate spinel. These magnesium aluminate spinel particulates precipitate from the Mg-doped sapphire solid solution.

In this case, the first phase (continuous matrix phase) corresponds to the host crystal, i.e., sapphire, or a solid solution of sapphire and Mg that is not fully precipitated out of the sapphire host crystal. The second phase corresponds to magnesium aluminate spinel (second phase particulates). As a result, the first phase and the second phase possess different compositions and different crystal structures.

The formation of the second phase particulates comprising magnesium aluminate spinel results in precipitation-hardening or precipitation-strengthening. The increased strength originates from the increase in volume associated with the magnesium aluminate spinel particulates. Stress or strain fields are produced from the volumetric mismatch between the magnesium aluminate spinel particulates and the sapphire host crystal. In the process of the present invention, however, the magnesium aluminate spinel particulates are held to a small enough size that these second phase particulates impart greater fracture strength while not significantly degrading the IR transmission when compared with untreated sapphire. Consequently, precipitation-hardening with magnesia improves the compressive strength of sapphire while retaining IR transmission.

In accordance with the present invention, a process is provided for strengthening a sapphire article. The sapphire article has a volume comprising sapphire and has an outer surface.

Magnesium is diffused into at least a portion of the sapphire by exposing the sapphire article to magnesium vapor at a first temperature. If sufficient amounts of Mg are diffused into the sapphire, then a portion of the sapphire adjacent the outer surface is converted into a layer of magnesium aluminate spinel. The layer of magnesium aluminate spinel has a crystal structure corresponding to a spinel structure.

The sapphire article is then heated to a second temperature, which is higher than the first temperature, without exposing the sapphire article to magnesium vapor. The magnesium which has been diffused into the sapphire is thereby caused to be homogeneously distributed throughout the volume of the sapphire article. (In the case where a layer of magnesium aluminate spinel is formed adjacent the outer surface of the sapphire, magnesium in this layer of magnesium aluminate spinel is caused to be homogeneously distributed throughout the volume of the sapphire article.)

The sapphire article is quenched to thereby cool the sapphire article to a third temperature, which is lower than the first temperature. The sapphire article is annealed at that third temperature. Precipitation of magnesium aluminate spinel particulates comprising magnesium aluminate is thereby caused. The magnesium aluminate spinel particulates have a crystal structure corresponding to the spinel structure. These magnesium aluminate spinel particulates serve to precipitation-harden the sapphire article. Additionally, the magnesium aluminate spinel particulates are uniformly distributed throughout the volume if sufficient time is spent at the second temperature to homogenize the magnesium distribution.

The process of the present invention enables sapphire articles to be strengthened such that the resistance of the sapphire article to thermal shock is improved. Advantageously, the sapphire article may be shaped and formed prior to employing the process of the invention. In particular, the process of the invention is applicable to shaped domes and windows comprising sapphire. The sapphire article, such as a shaped dome or window, is strengthened with the process of the present invention without degrading the IR transmission, optical scattering, or emittance properties.

The improvement in strength and the IR transmission will depend on both the concentration of magnesium aluminate spinel particulates and the size distribution of the precipitates. Control of these parameters are critical to a successful process.

The first temperature, and the duration over which the sapphire article is exposed to magnesium vapor at this temperature, determines how much magnesium is diffused into the sapphire and whether a layer of magnesium aluminate spinel is formed adjacent the outer surface of the sapphire, as described above.

The second temperature, and the duration over which the sapphire article remains at this temperature without exposure to magnesium vapor, governs the extent to which the Mg is homogenized throughout the sapphire article.

The third temperature, and the duration of the anneal, controls the size of the magnesium aluminate spinel particulates and how much magnesium in solid solution with the sapphire is consumed by precipitation of the magnesium aluminate spinel particulates (i.e., precipitated out in the form of $MgAl_2O_4$ spinel particulates).

Figure 6A:
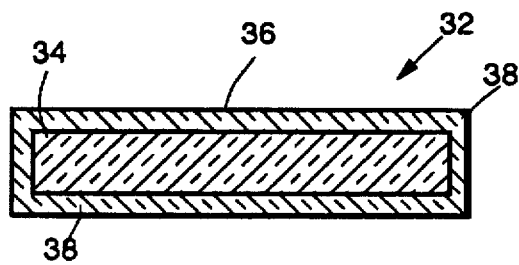
FIG. 6a is a cross-sectional view depicting the sapphire article after the diffusion of Mg by vapor phase transport.
Figure 6B:
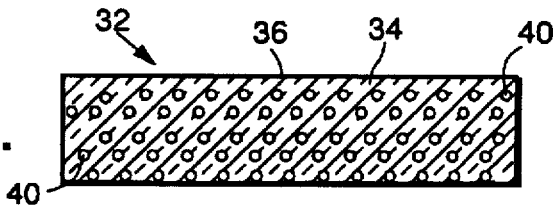
FIG. 6b is a cross-sectional view depicting the magnesium aluminate spinel particulates uniformly distributed throughout the sapphire article.

Referring now to FIG. 6a–6b, wherein like reference numerals designate like elements throughout, a sapphire article 32, e.g., a window formed from sapphire 34, is shown. FIG. 6a depicts the sapphire article 32 having a volume which is sapphire 34 and having an outer surface 36. As an example, the sapphire article 32 has a thickness of 40 mil (1 mm). To strengthen the sapphire article 32, the process of the present invention is employed. The process procedure of the invention now follows:

The sapphire article 32 is heated to a first temperature, e.g., within a range between about 1500° to 1750° C., preferably about 1600° to 1750° C., in the presence of Mg vapor for a time ranging, e.g., from about 5 minutes to 24 hours. The sapphire article 32 is heated in a reducing atmosphere such as an ambient hydrogen atmosphere comprising 100% hydrogen. Reducing atmospheres comprising hydrogen in other concentration may be employed as well. For example, the ambient hydrogen atmosphere may comprise about 5 to 100% hydrogen with the balance being nitrogen or other inert gases. The Mg vapor is provided by MgO powder which is heated with the sapphire article 32. Other suitable sources of Mg vapor may also be employed in the practice of the present invention. This processing step causes diffusion of Mg into the crystal lattice of the sapphire 34 thereby producing a solid solution of Mg and sapphire. The concentration of Mg in this solid solution is graded with the concentration being highest near the outer surface 36.

As described above, if a sufficient amount of magnesium is diffused into the sapphire 34, a layer of magnesium aluminate spinel 38 is formed from a portion of the sapphire adjacent the outer surface 36 of the sapphire article 32. The layer of magnesium aluminate spinel 36 has a thickness, e.g., of about 2 mils (0.05 mm). FIG. 6a shows the sapphire article 32 at this stage of processing.

The sapphire article 32, having Mg diffused therein, is next heated at a second temperature, e.g., within a range between about 1800° to 2000° C., such as 1900° C., in an ambient hydrogen atmosphere without the presence of Mg vapor; i.e., the MgO source is removed. The sapphire article 32 is heated at the second temperature for a time ranging, e.g., from about 2 to 24 hours. The ambient hydrogen atmosphere may comprise, e.g., 100% hydrogen. As discussed above, the ambient hydrogen atmosphere is reducing. Reducing atmospheres comprising hydrogen in other concentrations may be employed as well. For example, the ambient hydrogen atmosphere may comprise about 5 to 100% hydrogen with the balance being nitrogen or other inert gases.

After the MgO source ($Mg^{2+}$ source) is removed, the concentration of Mg ions is equilibrated throughout the sapphire 34 by heat treatment at the second temperature. Magnesium in the layer of magnesium aluminate spinel 38 is also caused to diffuse throughout the volume of sapphire 34 in the sapphire article 32. Provided that the heat treatment is conducted for a sufficient period of time, the Mg ions are homogeneously distributed throughout the sapphire article 32. In this way the stresses caused by conversion to magnesium aluminate spinel, which has a lower volume than sapphire, is avoided.

For a sapphire article 32 having a given thickness, the concentration of Mg in solid solution with the sapphire 34 can be varied by forming the layer of magnesium aluminate spinel 38 to different thicknesses and then homogenizing at the second temperature.

The time required to heat the sapphire article 32 such that Mg is homogeneously distributed throughout can be derived from FIG. 5. Curve 30, for example, plots the thickness of the layer of magnesium aluminate spinel 38 formed from the sapphire 34 versus time at a temperature of 1900° C. At 1900° C., a layer of magnesium aluminate spinel 38 having a thickness of 40 mil (1 mm) is formed after 8 hours. The concentration gradients of Mg are different for the two cases, i.e., for a layer of magnesium aluminate spinel 38 having a thickness of 40 mil (1 mm) and for a layer of magnesium aluminate spinel 38 having a thickness of 2 mil (0.05 mm).

Curve 30 corresponds to the case wherein the layer of magnesium aluminate spinel 38 has a thickness of 40 mils (1 mm). In contrast, the sapphire article 32 described above has a thickness of 40 mil (1 mm): 2 mil (0.05 mm) of which comprises a layer of magnesium aluminate spinel 38 and the remaining 38 mil (0.95 mm) comprising sapphire 34. Although the concentration gradients of Mg are different for the two cases, 8 hours or more at 1900° C. is an approximate time required to cause the Mg within the layer of magnesium aluminate spinel 38 having a thickness of 2 mil (0.05 mm) to diffuse and homogenize throughout the sapphire article 32 having a thickness of 40 mil (1 mm). It will be appreciated that longer time is needed to homogenize the magnesium throughout the sapphire article 32 at temperatures lower than about 1900° C., and vice versa.

Next, the sapphire article 32 is quenched, i.e., cooled rapidly, to a third temperature, e.g., within a range between about 1200° to 1450° C. (such as 1450° C.). The sapphire article 32 is annealed or aged at this temperature for a time ranging, e.g., from about 0.1 to 60 hours. Magnesium aluminate spinel particulates 40 are thereby precipitated as shown in FIG. 6b. The sapphire article 32 is quenched fast enough to prevent significant precipitation of magnesium aluminate spinel particulates 40 during cooling. The sapphire article 32 is quenched at least about 10° C./minute.

The aging time, i.e., the length of time of annealing, determines the size of the magnesium aluminate spinel particulates 40. The size of the magnesium aluminate spinel particulates 40 increases with aging time. Consequently, controlling the aging time allows the size of the magnesium aluminate spinel particulates 40 to be controlled. The average size of the magnesium aluminate spinel particulates 40 is, e.g., within the range of about 40 to 1000 Å. The temperature and length of the anneal are selected to optimize the size and percent volume of the magnesium aluminate spinel particulates 40.

The third temperature and the duration of the anneal also governs how much magnesium in solid solution with sapphire is consumed by precipitation of the magnesium aluminate spinel particulates. If not all the magnesium is used to form magnesium aluminate spinel particulates 40, the continuous matrix phase (first phase) is the solid solution formed between the remaining Mg dopants and the sapphire 34.

As described above, the concentration of Mg in the Mg-doped sapphire solid solution is dependent upon the amount of Mg diffused into the sapphire 34. The concentration of Mg in the Mg-doped sapphire solid solution is also related to the thickness of the layer of magnesium aluminate spinel 38 (if present). Accordingly, the volume fraction of the magnesium aluminate spinel particulates 40 within the sapphire 34 may be controlled (or partially controlled) by controlling the amount of Mg diffused in the sapphire 34 or the thickness of the layer of magnesium aluminate spinel 38. From this, it follows that the volume percent of magnesium aluminate spinel particulates 40 can be varied accordingly to accommodate or optimize both the optical and mechanical properties.

Advantageously, the process of the present invention allows magnesia, which exhibits low solubility in sapphire, to be introduced into sapphire via a non-melt type process. In particular, the vapor phase transport of magnesium is employed to dope sapphire 34 with Mg. Consequently, the process of the present invention obviates the need to use melt processing to form a magnesium-doped sapphire solid solution.

Employing a non-melt type process greatly facilitates process control required to carefully nucleate and grow precipitates. In particular, both the size and the volume fraction of the second-phase precipitate are controlled during annealing. Additionally, the process of the present invention enables the controlled dissolution of a MgO dopant into sapphire 34. As a result of employing the process of the present invention, a sapphire article 32 can be strengthened by precipitation-hardening without degrading the IR transmission or causing optical scattering.

No other prior art known to the inventors teaches precipitation-hardening of sapphire 34 using magnesium aluminate spinel particulates 40 as the precipitate, due to the difficulty of fabricating such material. The process of the present invention differs from the application of the vapor phase transport of Mg reported by Navias, which involves the conversion of a sapphire article 32 into a composite having a central region or core comprising sapphire 34 that is surrounded by an outer layer comprising magnesium aluminate spinel. The concentration of the Mg between the outermost regions of the sapphire 34 which are converted to magnesium aluminate spinel and the core comprising pure sapphire is not homogeneous, but varies in a graded manner. In particular, Navias shows a continuous change in composition from $1MgO:1Al_2O_3$ to $1MgO:2-3Al_2O_3$. Thus, the sapphire article 32 disclosed by Navias is transformed into a graded refractive index optical element. Navias does not show the formation of a uniform Mg-doped sapphire solid-solution having uniform concentrations of Mg throughout the bulk of the article. Nor does Navias report strengthening the sapphire 34 by precipitating second phase particulates comprising $MgAl_2O_4$.

In contrast, the process of the present invention is directed to a method in which magnesium aluminate spinel particulates 40 are precipitated from a Mg-doped sapphire solid-solution having uniform concentrations of Mg therethroughout. Thus, the magnesium aluminate spinel particulates 40 are also uniformly distributed throughout the sapphire 34. These spinel particulates 40 serve to increase the strength of the sapphire article 32.

The process of the present invention results in an improvement of the mechanical properties of a sapphire article 32 without adversely affecting the optical properties of the sapphire 34. The process of the present invention strengthens sapphire 34 and, in particular, improves resistance of sapphire to thermal shock. Thermal shock resistance is proportional to the fracture strength and inversely proportional to the thermal conductivity. In order to "engineer" a sapphire article 32 which is thermal shock resistant due to precipitation strengthening, the improvement in the fracture strength must be greater than any decrease in the thermal conductivity. The calculated effect of the precipitation of magnesium aluminate spinel particulates 40 on the thermal conductivity of sapphire 34 is small. The thermal conductivity equation for a two-phase system having a continuous matrix (in this case, sapphire 34 which may include Mg in solid solution therewith) is:

$$k_m = k_c \frac{1 + 2v_d(1 - k_c/k_d)/(2k_c/k_d + 1)}{1 - v_d(1 - k_c/k_d)/(k_c/k_d + 1)}$$

where $k_m$ corresponds to the thermal conductivities of the two-phase composite; i.e., the sapphire precipitation strengthening is such that second phase particulates comprising magnesium aluminate spinel are formed therein. The variables $k_c$ and $k_d$ correspond to the thermal conductivities of the continuous matrix (sapphire 34 which may include Mg in solid solution therewith) and of the dispersed phase material (magnesium aluminate spinel particulates 40), respectively. The variables $v_c$ and $v_d$ correspond to the volume fraction of the continuous matrix (sapphire 34 which may have Mg dopants therein) and the volume fraction of the dispersed phase material (magnesium aluminate spinel particulates 40), respectively.

The calculation using the thermal conductivity equation for a two-phase system shows that the thermal conductivity of sapphire 34 with 5 volume % second phase particulates comprising magnesium aluminate spinel will be 95.5 percent of the value for undoped sapphire. Thus, any improvement in the fracture strength over 5 percent will improve the thermal shock resistance. Examples from the literature, i.e., precipitation-strengthening of MgO by $MgFe_2O_4$, suggest that an improvement in the compression fracture strength for precipitation strengthened ceramics of threefold can be achieved. As a result, the thermal shock resistance of sapphire 34 which is precipitation-strengthened with magnesium aluminate particulates 40 can be significantly improved.

As described above, the process of the present invention for precipitation-hardening sapphire 34 advantageously improves the mechanical properties of a sapphire article 32. Additionally, the transmission of IR radiation having wavelengths between 1 to 5.5 μm will be unaffected by the precipitation of second phase particulates comprising magnesium aluminate.

Figure 7:
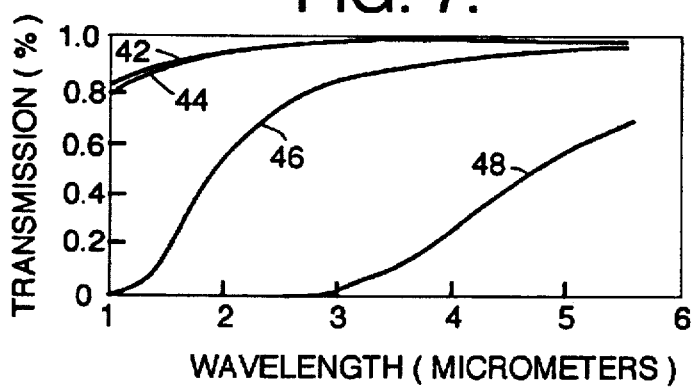
FIG. 7, on coordinates of transmission (in percent) and wavelength (in micrometers), plots the calculated IR transmission of the sapphire after precipitation-hardening versus wavelength for various sized precipitates.

A model based upon Mie scattering theory enables the calculation of the level of in-line scattering caused by the incorporation of the magnesium aluminate spinel particulates 40 for light having wavelength of 1 to 5.5 μm. By in-line scattering is meant scattering from light directed perpendicular to a sapphire article 32 (e.g., a sapphire window). The model shows how various parameters associated with the magnesium aluminate spinel particulates 40 (e.g., volume percent, particulate size, refractive index mismatch between the host matrix and the second phase particulates) influence the optical in-line transmission of the sapphire 34 which is precipitation-hardened using the process of the present invention. FIG. 7 shows the calculated IR transmission of sapphire 34 containing 5 volume percent (vol %) second phase particulates comprising magnesium aluminate spinel. In particular, FIG. 7 plots the calculated IR transmission of the sapphire 34 after precipitation-hardening versus wavelength for various sized precipitates. Curves 42, 44, 46, and 48 correspond to particulate diameters of 50 Å, 100 Å, 500 Å, and 1750 Å, respectively. The refractive index mismatch between the sapphire 34 and the magnesium aluminate spinel particulates 40 used is 0.041. The indices of refraction for the sapphire 34 and magnesium aluminate spinel particulates 40 for light having wavelength of about 650 nm is employed in the calculation. The thickness of the sapphire article 32 used in the calculation is 2 min. Curves 42, 44, 46, and 48 show that the incorporation of magnesium aluminate spinel particulates 40 which are small, i.e., having diameters of about 50 Å, do not affect the infrared in-line transmission.

As described above, however, precipitation-strengthening of MgO by $MgFe_2O_4$ indicates that the maximum strength of the precipitate hardened magnesia crystal is achieved when nucleated magnesioferrite precipitate are 40 Å in size. Accordingly, the precipitation of iron magnesium spinel ($MgFe_2O_4$) into single crystal magnesia shows that second phase particulates having small size on the order of 40 Å significantly improve the mechanical properties.

The effect of the second phase precipitate comprising magnesium aluminate spinel on the emittance of sapphire 34 at elevated temperature is minimal. In the IR region between 3 to 5 micrometers in wavelength, sapphire has an average emittance of 0.26 at 1000° C. Magnesium aluminate spinel has an average emittance of 0.50 at 650° C. for the same IR region. For the addition of 5 vol % of magnesium aluminate spinel particulates 40 into sapphire 34, the emittance is calculated to increase by only 5 percent at 650° C. For magnesium aluminate spinel particulates 40 which are small in size, i.e., 50 Å in diameter, angular scattering is not expected to be significant.

In an alternate embodiment of the present invention, the Mg ions diffused into the sapphire 34 are not completely homogenized throughout the sapphire article 32. Rather, a gradient in Mg concentration is provided where the concentration of Mg is higher near the outer surface 36 of the sapphire article 32. To provide such a distribution of Mg, the duration of heat treatment of the sapphire 34 (i.e., when the sapphire article 32 is heated to the second temperature without being exposed to the $Mg^{2+}$ source) is abbreviated. Consequently, the Mg ions are not completely homogenized throughout the sapphire article 32.

The remaining process steps are the same. Thus, magnesium aluminate spinel particulates 40 (and any Mg not consumed in the formation of the particulates which is in solid solution with the sapphire host crystal) are not uniformly distributed throughout the sapphire article 32. Rather the concentration of magnesium aluminate spinel particulates 40 (and any Mg in solid solution with the sapphire host crystal) is higher near the outer surface 36. Accordingly, "pre-stressing" or tempering of the sapphire 34 is provided near the outer surface 36, while the concentration of magnesium aluminate spinel particulates 40 in the remainder of the sapphire article 32 (the bulk) is minimized. In this manner, strengthening is obtained with less degradation of the IR transmission.

EXAMPLES

Sapphire articles 32 were precipitation-hardened using the process of the present invention after fabrication and were examined. Four sapphire articles 32 were cut from a large sheet of sapphire 34, i.e., Sapphikon EFG (sapphire "edge fed grown" from the melt, available from Sapphikon, Inc., Milford, N.H.). The sapphire articles 32 had a thickness of approximately 0.8 mm (0.031 inch) and an aperture diameter of about ½ inch (1.27 cm). The sapphire articles 32 were heated to 1700° C. in the presence of Mg vapor in a hydrogen ambient atmosphere. The Mg vapor was provided by MgO powder.

A visual inspection of the sapphire articles 32 after exposure to vaporized MgO revealed that a thin milky layer, i.e., a layer of magnesium aluminate spinel 38, had formed inhomogeneously at the outer surface 36 of each of the sapphire articles.

Two of the four sapphire articles 32 were heated to 1900° C. in an ambient hydrogen atmosphere without a source of vaporized MgO. The two sapphire articles 32 were heated in a two-step heating and cooling profile. In the first part of the two-step heating and cooling profile, the two sapphire articles 32 were heated at 1900° C. to homogenize the Mg distribution which was concentrated in the thin milky layer.

In the second step of the two-step heating and cooling profile, the sapphire articles 32 were cooled rapidly to 1450° C. and held at that temperature for a period of time, thereby precipitating magnesium aluminate spinel particulates 40. After processing as described above, the two sapphire articles 32 appeared optically clear and colorless. Some surface roughness existed on the two sapphire articles 32.

Figure 8:
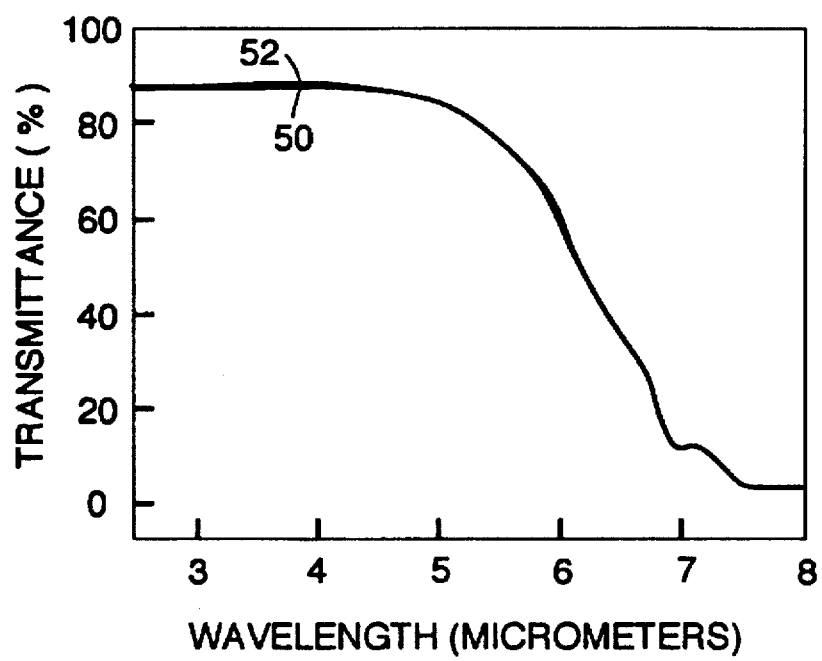
FIG. 8, on coordinates of transmission (in percent) and wavelength (in micrometers), plots the IR transmission from 2.5 to 8 micrometers vs. wavelength for a first sapphire article after precipitation-hardening with magnesium aluminate spinel particulates.
Figure 9:
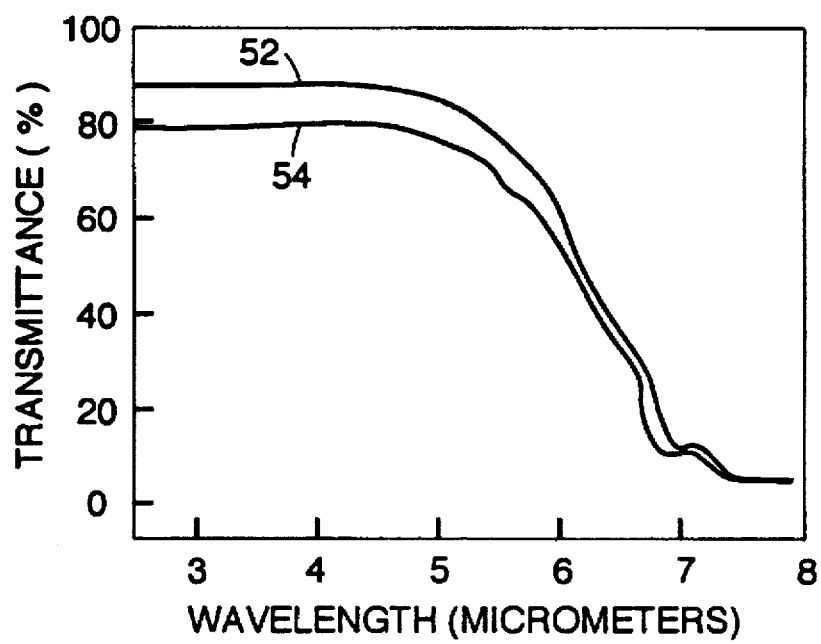
FIG. 9, on coordinates of transmission (in percent) and wavelength (in micrometers), plots the IR transmission from 2.5 to 8 micrometers vs. wavelength for a second sapphire article after precipitation-hardening with magnesium aluminate spinel particulates.

Heating at 1900° C. to homogenize the Mg throughout the sapphire 34 and the annealing to precipitate magnesium aluminate particulates 40 did not appear to significantly affect the IR transmission. The effects of the processing described above upon the infrared transmission of sapphire 34 for two sapphire articles 32 are shown in FIGS. 8 and 9. FIGS. 8 and 9 depict the IR transmission from 2.5 to 8 micrometers in wavelength for the MgO-doped sapphire (after precipitation-hardening with magnesium aluminate spinel particulates 40) for the two sapphire articles 32: sapphire article No. 1 and sapphire article No. 2, respectively. Curve 50, in FIG. 8, plots the IR transmission versus wavelength for sapphire article No. 1. Curve 52, in FIG. 8, plots the IR transmission versus wavelength for baseline sapphire, i.e., untreated sapphire. The IR transmission for sapphire article No. 1 shows no degradation in comparison with baseline sapphire. Curve 54, in FIG. 9, plots the IR transmission versus wavelength for sapphire article No. 2. Curve 52, in FIG. 9, plots the IR transmission versus wavelength for baseline sapphire, i.e., untreated sapphire. The IR transmission for sapphire article No. 2 exhibits a small decrease in optical transmission from 85 to 78 percent at 3 μm. The IR transmission was measured using the as-processed, i.e., unpolished, outer surface 36 of the sapphire articles 32. Consequently, precipitation strengthening with magnesium aluminate spinel particulates 40 resulted in little change in IR transmission of the sapphire 34.

However, IR transmission of sapphire article No. 2 showed a small decrease upon precipitation strengthening with magnesium aluminate spinel particulates 40. This decrease in IR transmission may be due to the scattering at the outer surface 36 as a result of surface roughness. Alternatively, this decrease in IR transmission may be due to layer inhomogeneity, i.e., the layer of magnesium aluminate spinel had formed inhomogeneously at the outer surface 36 of the sapphire article 32 and did not completely cover the outer surface.

The IR transmission of the baseline sapphire shown in FIGS. 8 and 9 is not consistent with the calculated IR transmission of the precipitation-hardened sapphire shown in FIG. 7. The dispersion equation used in the calculation of the IR transmission for the precipitation-hardened sapphire did not yield the correct value of refractive index for the IR region. The dispersion equation employed to calculate the loss due to two Fresnel reflections at the sapphire/air interface for each side of the sapphire articles 32 corresponds to:

$$n = \sqrt{1 + \left(\frac{1.023798\lambda}{\lambda^2 - 0.00377588}\right) + \left(\frac{1.058264\lambda^2}{\lambda^2 - 0.0122544}\right) + \left(\frac{5.280792\lambda^2}{\lambda^2 - 321.3616}\right)}$$

where n and λ are the refractive index and wavelength (in micrometers), respectively. The measured refractive index was 1.7 while the calculated value was 1.3. However, if a more accurate dispersion equation is employed, the IR transmission calculated should match with the IR transmission measured.

Regardless, the IR transmission, both as calculated and as measured, is not adversely affected if the magnesium aluminate spinel particulates 40 are small, i.e., about 50 Å.

The precipitation-hardening of the sapphire articles 32 with magnesium aluminate particulates 40 increases the hardness of the sapphire 34. The average Vicker's hardness ($H_v$) values as well as the IR transmission for the sapphire articles 32 (sapphire article No. 1 and sapphire article No. 2) which were precipitation-hardened with the process of the present invention are listed in Table 2. Table 2 also lists the IR transmission and average Vicker's hardness for baseline sapphire. The average values are derived from 5 indentations on each sapphire article 32 using a 1 kg load. The Vicker's hardness for the sapphire article No. 1 and sapphire article No. 2, which were precipitation-hardened with the process of the invention, is approximately 10 percent higher than that of the baseline sapphire.

TABLE 2

VICKER'S HARDNESS AND IR TRANSMISSION FOR PRECIPITATION-HARDENED SAPPHIRE AND UNTREATED SAPPHIRE.

|  | IR Transmission (at 4 μm) | Vicker's Hardness, $H_v$ (Gpa; 1 Kg Load) |
|---|---|---|
| Baseline sapphire | 85% | 16.6 ± 60 |
| Sapphire Article No. 1 | 83% | 18.1 ± 0.34* |
| Sapphire Article No. 2 | 78% | 18.1 ± 0.21* |

* As-processed (unpolished) surfaces.

The examples above prove that heating a sapphire article 32 to a temperature within the range of about 1500° to 1900° C. in an ambient hydrogen atmosphere in the presence of Mg or MgO vapor causes Mg to diffuse into the sapphire 34. A layer of magnesium aluminate spinel 38 is formed which adheres to the sapphire 34 (without cracking). After heating at a temperature within the range of about 1500° to 1900° C. in an ambient hydrogen atmosphere without Mg or MgO vapor, quenching, and annealing at a lower temperature, e.g., 1450° C., precipitation-hardening of the sapphire article 32 can be achieved.

The sapphire 34 after precipitation-hardening is multiphase, i.e., comprising multiple phases. As described above, the first phase corresponds to the sapphire host crystal (which may have Mg in solid solution therewith) and the second phase corresponds to the magnesium aluminate spinel, each of which have different compositions and crystal structures. The second phase particulates comprise magnesium aluminate spinel precipitated in the first phase, i.e., the sapphire host matrix. The sapphire articles 32 after precipitation-hardening are colorless and optically transparent. The precipitation-hardening of the sapphire articles 32 does not degrade the IR cut-off and slightly increases the hardness of the sapphire 34.

In the examples described above which demonstrate the process of the present invention, the conditions for precipitation-hardening sapphire articles 34 have not been optimized. The volume fraction of second phase particulates comprising magnesium aluminate spinel appears to be too small due to shortened processing at 1700° C. in the presence of Mg vapor. Additionally, the $MgAl_2O_4$ precipitates could be overaged. The magnesium aluminate spinel particulates 40 grew too large, due to excessive aging. Consequently, only a small improvement in the Vicker's hardness was achieved.

However, the inventors have found that magnesia is a suitable elastic and optical dopant and that precipitation-hardening of sapphire 34 with magnesia is practical using vapor phase transport in a hydrogen atmosphere. Additionally, precipitation-hardening with magnesium aluminate spinel particulates 40 improves the compressive strength of sapphire articles 32 by increasing the c-axis compressive strength while retaining high thermal conductivity and IR transmission.

Unlike conventional solid solution doping with chromium, the process of the present invention employs a vapor deposition method to form second phase particulates of magnesium aluminate spinel in a previously fabricated sapphire article 32. Accordingly, the process of the present invention is a post-fabrication treatment which can be employed after windows or domes are shaped from sapphire 34.

Additionally, conventional solid-solution hardening of sapphire 34 employs melt processing and subsequent equilibrium solidification which is implemented before fabrication operations. In contrast, the precipitation-hardening treatment of the present invention is a non-equilibrium process which is employed on the finished sapphire articles 32. Thus, the process of the present invention circumvents the difficulties associated with melt doping, e.g., melt doping of Ti and Cr, by employing a vapor phase method for introducing the cation Mg.

The process of the present invention is characterized as a bulk method. Doping of sapphire articles 32 provides a fundamental modification of the sapphire 34 as opposed to changes in the external processing, polishing, or surface treatment.

The process of the present invention which employs precipitation-hardening offers a method to improve the compressive strength of sapphire articles 32 while retaining its high thermal conductivity and IR transmission. Table 3 lists the characteristics of the process of the present invention for precipitation-strengthening sapphire articles 32. Table 3 indicates that the process of the present invention significantly improves the thermal shock resistance of sapphire 34 without degrading the IR transmission, scattering, emittance properties, and thermal conductivity. In Table 3, maximal IR transmission, minimal IR scattering, and minimal IR emittance are characterized as favorable.

TABLE 3

CHARACTERISTICS OF PRECIPITATION STRENGTHENING OF THE PROCESS OF THE PRESENT INVENTION

| Property | Precipitation Strengthening (Present Invention) |
|---|---|
| Ease of fabrication | Yes |
| Potential increase in compressive strength | Large (estimated) |
| IR transmission | Good |
| IR scattering | Good |
| IR emittance | Good |
| Problems | None |

Increasing the compressive strength of sapphire 34 solves the problem of poor thermal shock resistance. Increased thermal shock resistance means that the missile domes and windows formed from sapphire 34 are less likely to fail. Additionally, employing windows and domes which are precipitation-strengthened with the process of the present invention permits thinner windows to be employed, thereby providing increased IR transmission. The process of the present invention is applicable to precipitation-hardening windows for submarine periscopes which have IR sensor capability. Such windows comprising sapphire which are precipitation-hardened will benefit from the increased strength. Additionally, the thickness of the windows used for the submarine periscopes can be reduced thereby improving the IR transmission and, accordingly, the performance of the IR sensor.

Thus, there has been disclosed a process for improving the compressive strength of sapphire articles 32 as well as the resistance of sapphire 34 to thermal shock while retaining high thermal conductivity and IR transmission. The process of the invention for precipitation-strengthening sapphire articles 32 can be applied to previously shaped domes and windows comprising sapphire, and in particular, missile domes and submarine periscope windows. It will be readily apparent to those skilled in this art that various changes and modifications of an obvious nature may be made, and all such changes and modifications are considered to fall within the scope of the invention, as defined by the appended claims.

What is claimed is:

1. A process for strengthening a sapphire article having a volume comprising sapphire and having an outer surface, said process comprising the steps of:
   (a) diffusing magnesium into at least a portion of said sapphire by exposing said sapphire article to magnesium vapor at a first temperature for a first time period;
   (b) heating said sapphire article to a second temperature within the range of about 1800° to 2000° C., in the absence of magnesium vapor, for a second time period within the range of about 2 to 24 hours, thereby causing said magnesium to be substantially homogeneously distributed throughout said volume of said sapphire article;
   (c) quenching said sapphire article to thereby cool said sapphire article to a third temperature within the range of about 1200° to 1450° C. over a third time period at a cooling rate of at least about 10° C./minute; and
   (d) annealing said sapphire article at said third temperature for a fourth time period within the range from about 0.1 to 60 hours, thereby causing precipitation of magnesium aluminate spinel crystal particulates comprising magnesium aluminate spinel having said spinel crystal structure, said magnesium aluminate spinel particulates serving to precipitation-harden said sapphire article.

2. The process of claim 1 wherein said sapphire comprises Al$_2$O$_3$ having a crystal structure corresponding to a corundum structure.

3. The process of claim 1 wherein said first time period over which said sapphire article is exposed to magnesium vapor in said step (a) is sufficient to convert a portion of said sapphire adjacent said outer surface into a layer of magnesium aluminate spinel having a spinel crystal structure.

4. The process of claim 1 wherein said fourth time period over which said sapphire article is heated in said step (d) is not sufficient to cause all said magnesium diffused in said sapphire to be consumed in said precipitation of magnesium aluminate spinel particulates such that said sapphire contains magnesium in solid solution therewith, thereby serving to solid-solution strengthen said sapphire article.

5. The process of claim 1 wherein said sapphire article is selected from the group consisting of sapphire windows and sapphire domes.

6. The process of claim 1 wherein said sapphire articles are shaped and formed prior to diffusing said magnesium into at least a portion of said sapphire.

7. The process of claim 1 wherein said magnesium vapor is produced by a magnesia source.

8. The process of claim 1 wherein said first temperature is within the range of about 1500° to 1750° C. and said first time period over which said sapphire article is heated at said first temperature is within a range from about 5 minutes to 24 hours.

9. The process of claim 8 wherein said sapphire article is heated at said first temperature in an ambient hydrogen atmosphere comprising about 5 to 100% hydrogen.

10. The process of claim 1 wherein said sapphire article is heated at said second temperature in an ambient hydrogen atmosphere comprising about 5 to 100% hydrogen.

11. The process of claim 1 wherein said magnesium aluminate spinel particulates have an average particle size within the range of about 40 to 1000 Å, said particle size depending on said fourth time period over which said sapphire article is annealed in step (d), with larger particle sizes being associated with longer times.

12. A process for strengthening a sapphire article having a volume consisting essentially of sapphire, said sapphire consisting essentially of Al$_2$O$_3$ having a crystal structure corresponding to a corundum structure and having an outer surface, said process comprising the steps of:
   (a) diffusing magnesium into at least a portion of said sapphire by exposing said sapphire article to magnesium vapor produced by a magnesia source at a first temperature of about 1750° C. in an ambient hydrogen atmosphere for a period of time of about 5 minutes, thereby converting a portion of said sapphire adjacent said outer surface into a layer of magnesium aluminate spinel having a spinel crystal structure;
   (b) heating said sapphire article to a second temperature of about 1900° C. in the absence of magnesium vapor and in an ambient hydrogen atmosphere for a period of time of about 6 hours, thereby causing said magnesium in said portion of said sapphire to be homogeneously distributed throughout said volume of said sapphire article;
   (c) quenching said sapphire article to thereby cool said sapphire article to a third temperature of about 1450° C.; and
   (d) annealing said sapphire article at said third temperature for a period of time of about 1 hour, thereby causing precipitation of magnesium aluminate spinel particulates consisting essentially of magnesium aluminate spinel having said spinel crystal structure, said magnesium aluminate spinel particulates substantially uniformly distributed throughout said volume and serving to precipitation-harden said sapphire article.

* * * * *